United States Patent
Wei et al.

(10) Patent No.: US 6,862,207 B2
(45) Date of Patent: Mar. 1, 2005

(54) STATIC RANDOM ACCESS MEMORY

(75) Inventors: Liqiong Wei, Portland, OR (US); Kevin Zhang, Portland, OR (US)

(73) Assignee: Intel Corporation, Santa Clara, CA (US)

(*) Notice: Subject to any disclaimer, the term of this patent is extended or adjusted under 35 U.S.C. 154(b) by 34 days.

(21) Appl. No.: 10/271,500

(22) Filed: Oct. 15, 2002

(65) Prior Publication Data

US 2004/0071010 A1 Apr. 15, 2004

(51) Int. Cl.⁷ .......................... G11C 11/00; G11C 8/00
(52) U.S. Cl. ............. 365/154; 365/230.06; 365/185.16
(58) Field of Search ........................ 365/154, 230.06, 365/229, 196, 207, 185.16

(56) References Cited

U.S. PATENT DOCUMENTS

| | | | |
|---|---|---|---|
| 5,898,610 A | | 4/1999 | Greason |
| 5,946,264 A | * | 8/1999 | McClure ............... 365/230.06 |
| 6,044,011 A | * | 3/2000 | Marr et al. .................. 365/154 |
| 6,259,623 B1 | * | 7/2001 | Takahashi .................... 365/154 |
| 6,330,195 B2 | * | 12/2001 | Marr ..................... 365/189.09 |

* cited by examiner

*Primary Examiner*—Thong Q. Le
(74) *Attorney, Agent, or Firm*—Schwegman, Lundberg, Woessner & Kluth, P.A.

(57) ABSTRACT

A method and apparatus for a four transistor SRAM comprising an array or block of cells. Each cell comprises a pair of pass transistors and a pair of pull-down transistors. In one embodiment of the invention, when the SRAM block is in a standby mode, the difference between the voltage at the gate and the voltage at the source of each pass transistor is greater than 0, and less than the threshold voltage of the pass transistor. In one embodiment of the invention a ground connection of the memory cell is switched such that when the SRAM block is in the standby mode, the ground connection is a virtual ground connection and when the SRAM block is in an active mode the ground connection is a global ground connection.

34 Claims, 7 Drawing Sheets

STATIC RANDOM ACCESS MEMORY

BACKGROUND

1. Field of the Invention

The present invention is related to the field of memory devices. In particular, the present invention is related to Static Random Access Memory (SRAM).

2. Description of the Related Art

SRAM cells are commonly used to store information in electronic circuits. As compared with Dynamic Random Access Memory (DRAM), SRAM have faster access times and do not have to be refreshed. The evolution of smaller SRAM cells, e.g., the four transistor (4T) SRAM cell caused a significant improvement in the storage density on a given piece of silicon as compared with the six transistor (6T) SRAM cell.

FIG. 1 illustrates a conventional 4T SRAM. As illustrated in FIG. 1, a conventional 4T SRAM 100 typically comprises an array or a block of 'N+1' rows and 'M+1' columns of SRAM cells. Each SRAM cell 105 comprises a matched pair of P-channel Metal Oxide field effect Semiconductor (PMOS) transistors 102A–B (pass transistors) cross coupled with a matched pair of N-channel (NMOS) transistors 104A–B (pull-down transistors). As illustrated in FIG. 1, a storage node 120 is formed by coupling one end of the channel of PMOS transistor 102A, one end of the channel of NMOS transistor 104A, and the gate of NMOS transistor 104B. So also, storage node 125 is formed by coupling one end of the channel of PMOS transistor 102B, one end of the channel of NMOS transistor 104B, and the gate of NMOS transistor 104A. The storage nodes 120 and 125 store a binary bit and its complement respectively. Each PMOS transistor 102A–B has the other end of its channel coupled to a precharge circuit 135, the precharge circuit 135 is coupled to a power supply having a voltage of Vcc volts. As FIG. 1 illustrates, each of the memory cells is coupled to a complementary pair of bitlines, indicated by BL0 and BL0# respectively, which are precharged by the precharge circuit 135 prior to a read or write operation (for a M+1 column SRAM, the M+1 column has bitlines BLM and BLM# respectively).

The gate of each PMOS transistor 102A–B is coupled to a wordline that is driven by a decoder circuit 130. The decoder circuit 130 is coupled to a power supply having a voltage of Vcc volts. The wordlines are indicated by WL0–WLN (for a N+1 row SRAM) in FIG. 1, and are used to selectively enable memory cells to be read from or written to. The other terminal of each NMOS transistor 104A–B is coupled to a global ground connection 110.

Reducing the size of the SRAM cell from six transistors to four transistors, in order to maximize SRAM cell density, causes the 4T SRAM cell to be less stable during read operations and to have a higher off state leakage current as compared with the 6T SRAM cell. This is because in the design of the 6T SRAM cell, the two additional transistors prevent the bits on the storage nodes from changing their state. In addition, during read operations conventional 4T SRAM cells have a slower sensing speed and may leak causing the bits stored on the storage nodes of the SRAM cells to change their state (e.g., from a 0 to a 1 or vice versa). Moreover, in the off state, the 4T SRAM cells have a higher leakage current resulting in a higher power consumption.

BRIEF SUMMARY OF THE DRAWINGS

Example embodiments of the present invention are illustrated in the accompanying drawings. The accompanying drawings, however, do not limit the scope of the present invention. Similar references in the drawings indicate similar elements.

DETAILED DESCRIPTION

Figure 1:
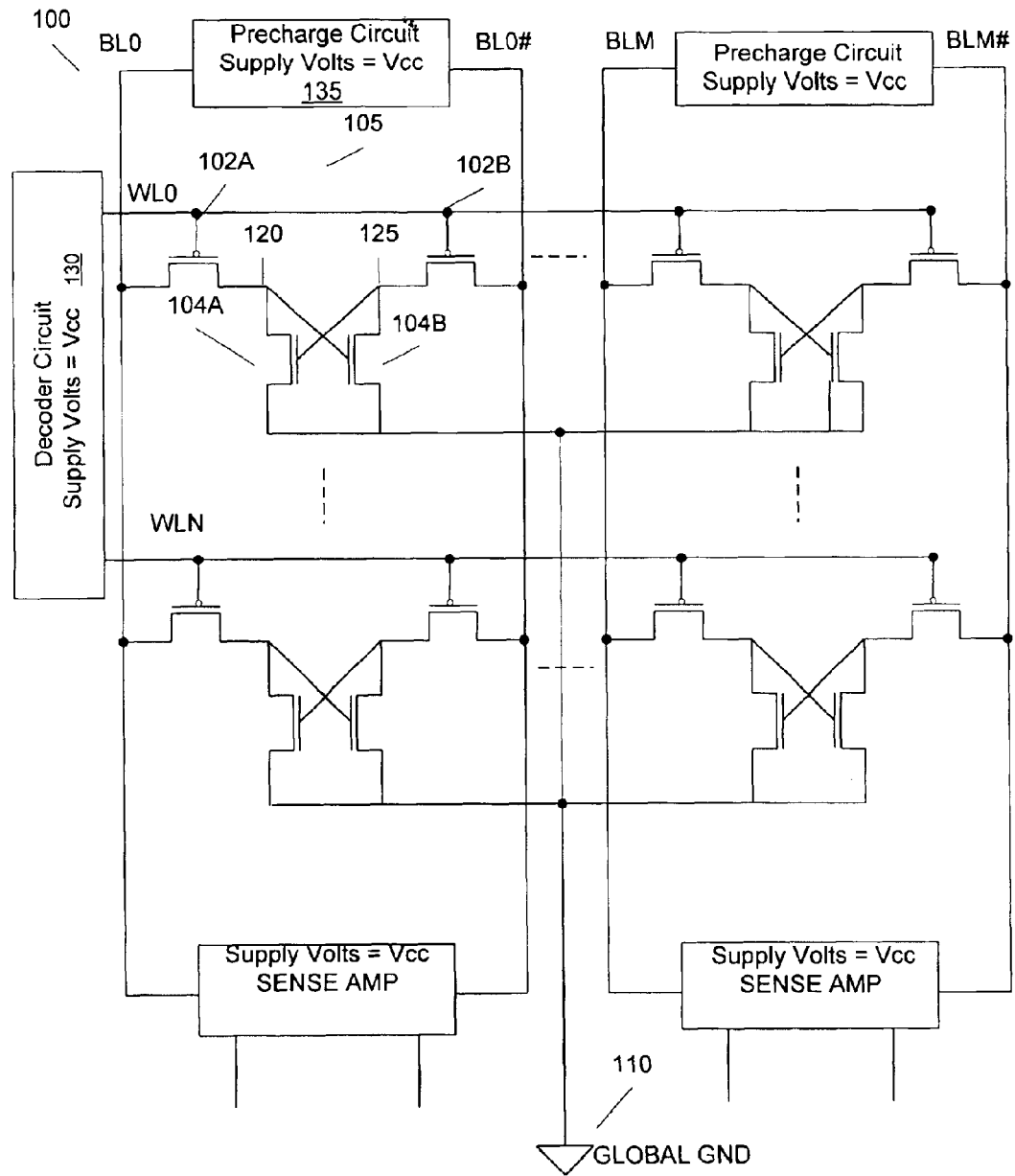
FIG. 1 illustrates a conventional 4T SRAM.

Described is a 4T static random access memory (SRAM). In one embodiment of the invention, an SRAM comprises an array or a block of cells. Each cell in the block of cells comprises a matched pair of pass transistors coupled with a matched pair of pull-down transistors. A storage node to store a binary bit is formed by coupling one end of the channel of a pass transistor, one end of the channel of a pull-down transistor, and the gate of the other pull down transistor. The other end of the channel (i.e., the source terminal) of the pass transistors of each cell is coupled to a precharge circuit having a power supply voltage of High Vcc volts. The gate of each pass transistor is coupled to a decoder circuit having a power supply voltage of Low Vcc volts. In one embodiment of the invention, when the SRAM block is in the standby mode i.e., when the cells in the SRAM block are not being read from or written to, the difference between the voltages at the source and the gate of the pass transistors is greater than 0 and less than the threshold voltage of the pass transistors. In one embodiment of the invention, a ground connection that couples each SRAM cell to a global ground connection, is switched (e.g., by a transistor switch) such that, when the SRAM block is in the standby mode, the ground connection is a virtual ground connection, and when the SRAM block is in the active mode, i.e., when the SRAM block is enabled and one or more of the memory cells are being read from or written to, the ground connection is substantially a global ground connection.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art to effect such feature, structure, or characteristic in connection with other embodiments whether or not explicitly described. Parts of the description are presented using terminology commonly employed by those of ordinary skill in the art to convey the substance of their work to others of ordinary skill in the art.

In the following description and claims, the terms "coupled" and "connected", along with derivatives such as "communicatively coupled" may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct physical contact with each other, but still co-operate or interact with each other.

Figure 2:
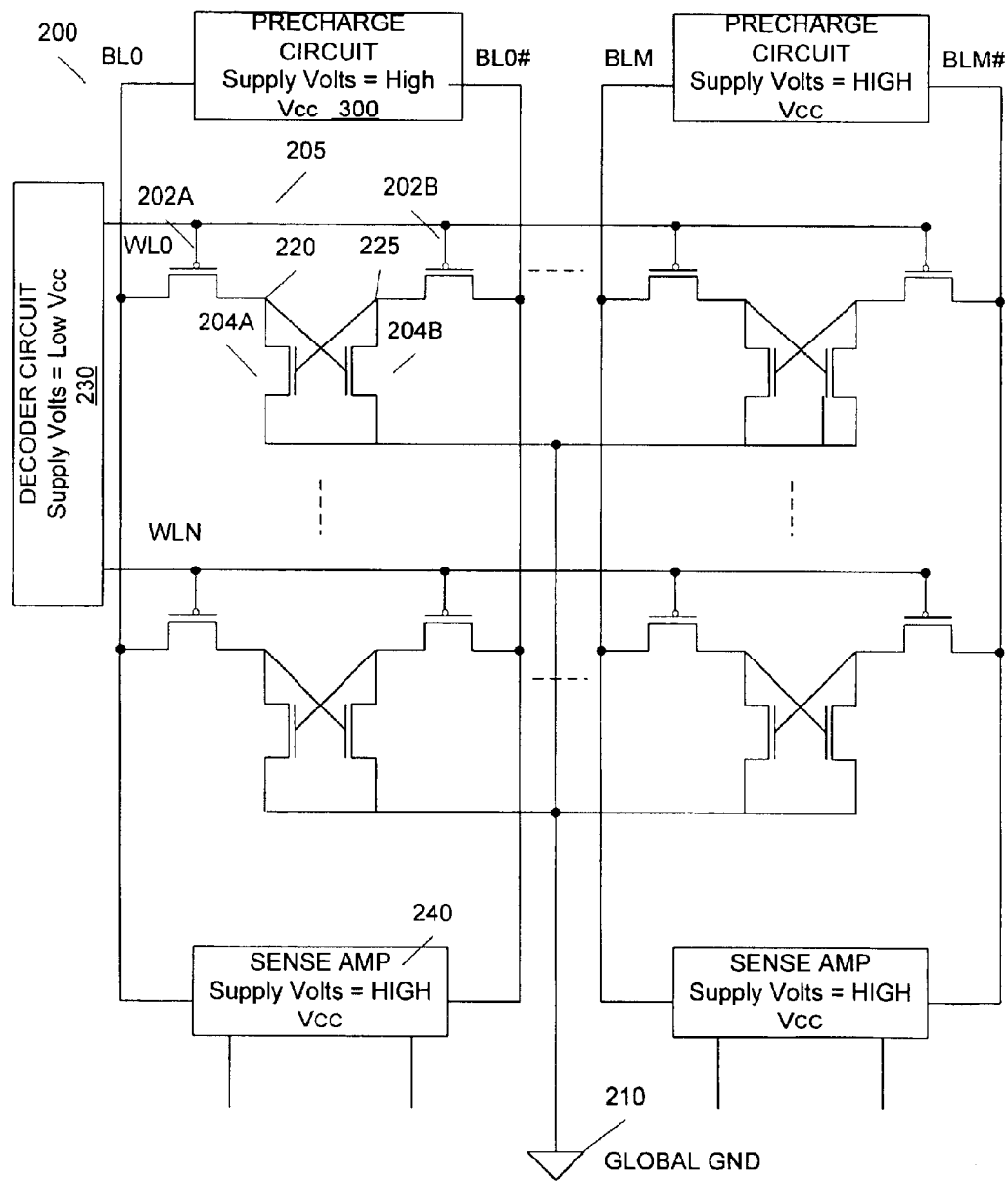
FIG. 2 illustrates an SRAM according to one embodiment of the invention.

FIG. 2 illustrates an SRAM according to one embodiment of the invention. As illustrated in FIG. 2, SRAM 200 comprises one or more SRAM cells 205 arranged in N+1 rows and M+1 columns. Each SRAM cell 205 comprises a matched pair of P-channel Metal Oxide field effect Semiconductor (PMOS) transistors 202A–B (pass transistors) with a matched pair of N-channel (NMOS) transistors 204A–B (pull down transistors). As illustrated in FIG. 2, a storage node 220 is formed by coupling one end of the channel of PMOS transistor 202A, one end of the channel of NMOS transistor 204A, and the gate of NMOS transistor 204B. So also, a storage node 225 is formed by coupling one end of the channel of PMOS transistor 202B, one end of the channel of NMOS transistor 204B, and the gate of NMOS transistor 204A. The storage nodes 220 and 225 are provided to store a binary bit and its complement respectively. Each PMOS transistor 202A–B has the other end of its channel coupled to a power supply, having a High Vcc voltage, through a precharge circuit 300.

Figure 3:
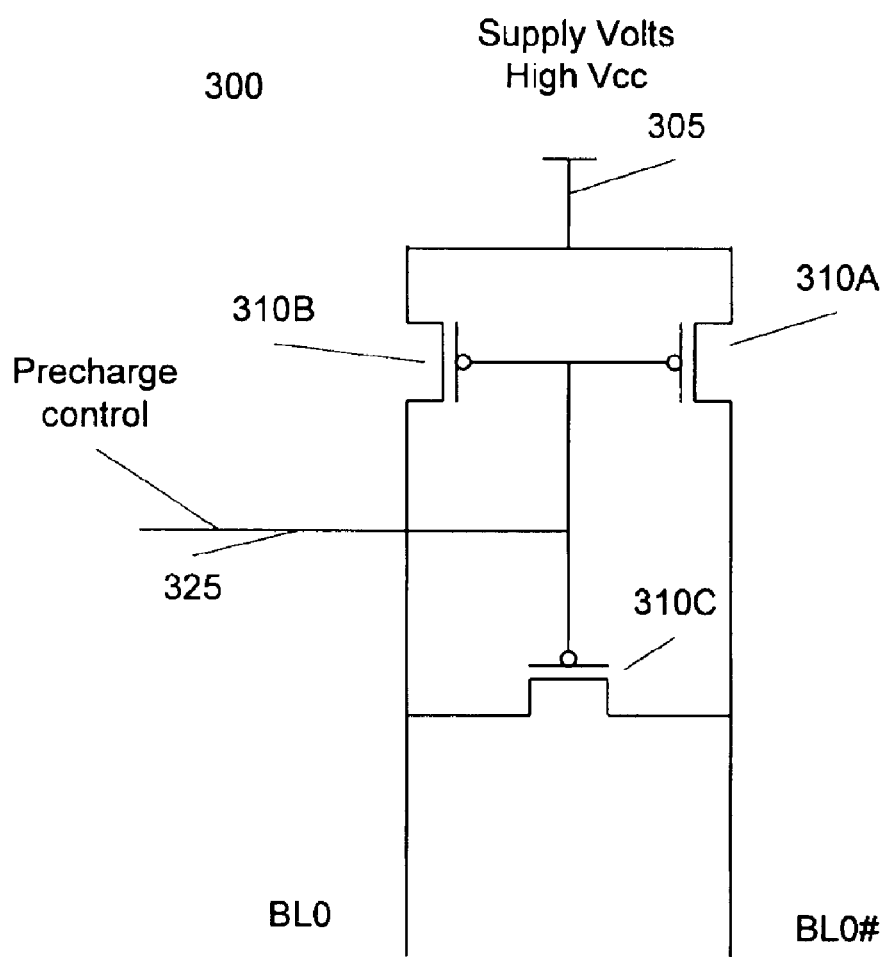
FIG. 3 illustrates a precharge circuit according to one embodiment of the invention.

FIG. 3 illustrates a precharge circuit according to one embodiment of the invention. As illustrated in FIG. 3, the precharge circuit 300 comprises three PMOS transistors 310A–C. PMOS transistors 310A–B are coupled to power supply 305 and to a complementary pair of bitlines BL0 and BL0# (for SRAM cell 205) respectively. PMOS transistor 310C is coupled between the complementary pair of bitlines BL0 and BL0#. A precharge control 325 from e.g., a memory controller (not shown) is coupled to the gates of the PMOS transistors 310A–C. The precharge circuit power supply 305 has a voltage of High Vcc volts. Therefore, the precharge circuit 300 precharges the complementary pair of bitlines BL0 and BL0# to a voltage of High Vcc volts prior to a read or write operation.

As illustrated in FIG. 2, the gates of each PMOS transistor 202A–B are coupled to a wordline that is driven by a decoder circuit 230. The wordlines, indicated by WL0–WLN (for a N+1 row SRAM), are used to turn the PMOS transistors on and off. Decoder circuit 230 is coupled to a second power supply (not shown) having a voltage of Low Vcc volts. Therefore, the decoder circuit 230 has a minimum output voltage of substantially 0 volts and a maximum output voltage of Low Vcc volts, where Low Vcc volts is less than the High Vcc volts output of the precharge circuit 300. In one embodiment of the invention, in addition to supplying the source voltage to precharge circuit 300, the power supply 305, having a voltage of High Vcc volts, supplies the power to at least sense amplifier 240. The sense amplifier 240, that is coupled between the complementary pair of bitlines BL0 and BL0#, senses a voltage differential across the complementary pair of bitlines BL0 and BL0# very rapidly and outputs the bit stored in the memory cell 205 to the SRAM's data output line. The Low Vcc power supply supplying power to the decoder circuit may supply power to other logic circuitry e.g., control logic circuitry etc. Thus, two power supplies having different power supply voltages are used to supply power to circuits in an SRAM block. When the SRAM block is in the standby mode, the difference between the voltages at the source and the gate of the pass transistors is greater than 0 and less than the threshold voltage of the pass transistors. As FIG. 2 illustrates, the other terminal of each NMOS transistor 204A–B is coupled to a global ground connection 210.

Figure 7A:
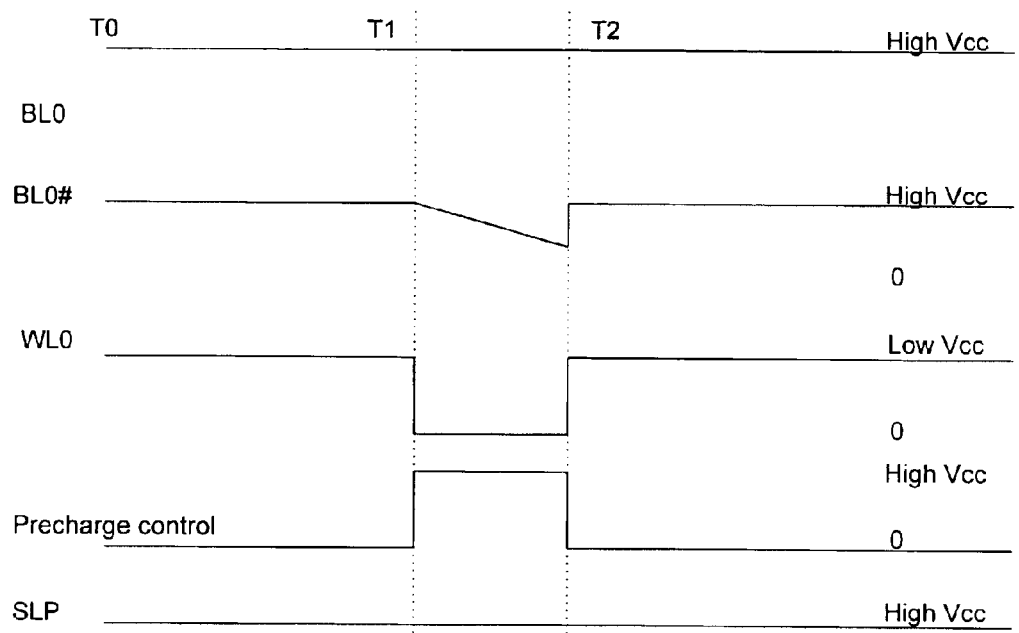
FIG. 7A illustrates a timing diagram for reading a bit stored in an SRAM cell according to one embodiment of the invention.

FIG. 7A illustrates a timing diagram for reading a bit stored in an SRAM cell according to one embodiment of the invention. As FIG. 7A illustrates, prior to a read operation, between times T0 and T1, the bitlines BL0 and BL0# are precharged to a High Vcc voltage by precharge circuit 300. Thereafter at T1, a wordline e.g., WL0 is enabled by decoder 230 asserting a voltage at the gate of PMOS transistors 202A–B to cause the PMOS transistors to turn on. Assuming a '1'is stored at storage node 220 and a '0' is stored at storage node 225, during the read operation (i.e., between times T1 and T2 of the active mode) PMOS transistor 202B and NMOS transistor 204B are enabled, and NMOS transistor 204A is disabled (due to the voltage present at their respective gates). During this time (i.e., between T1 and T2) precharge control 325 is driven to High Vcc volts to turn off the PMOS transistors 31A–C.

In order to maintain the bits stored at storage nodes 220 and 225 (when the SRAM block is in the active mode), the ratio of the 'on' resistance of PMOS transistor 202B to the 'on' resistance of NMOS transistor 204B is relatively large to prevent transistor 204A from being erroneously enabled and to cause the bits stored at storage nodes 220 and 225 to change. If this were not true, then an impermissibly large 'on' state current would flow through PMOS transistor 202B and through NMOS transistor 204B causing a higher voltage drop across NMOS transistor 204B. The higher voltage drop across NMOS transistor 204B would cause the gate voltage of NMOS transistor 204A to increase. This increase in voltage at the gate of NMOS transistor 204A causes transistor 204A to turn on thereby changing the state of the bit at storage node 220 from a '1' to a '0'. This change in state at storage node 220 causes NMOS transistor 204B to turn off changing the state of the bit at storage node 225 from a '0' to a '1'.

However, for the SRAM block in the standby mode the reverse is true, and it is desirable that the off resistance of the PMOS transistors are smaller than the off resistance of the NMOS transistors in order to maintain the integrity of the bits stored at storage nodes 220 and 225. In particular, it is desirable that the PMOS transistors 202A–B have a larger leakage current as compared with the NMOS transistors 204A–B in the standby mode to prevent the bits stored on storage nodes 220 and 225 from changing their state.

In order to balance these competing ohmic requirements between the active and standby modes, the PMOS transistors 202A–B in the SRAM cell 205 are made physically smaller as compared with the NMOS transistors 204A–B during the manufacture of the SRAM. Smaller pass transistors increase the resistance of the pass transistors making the SRAM cell 205 stable during the active mode.

Figure 7B:
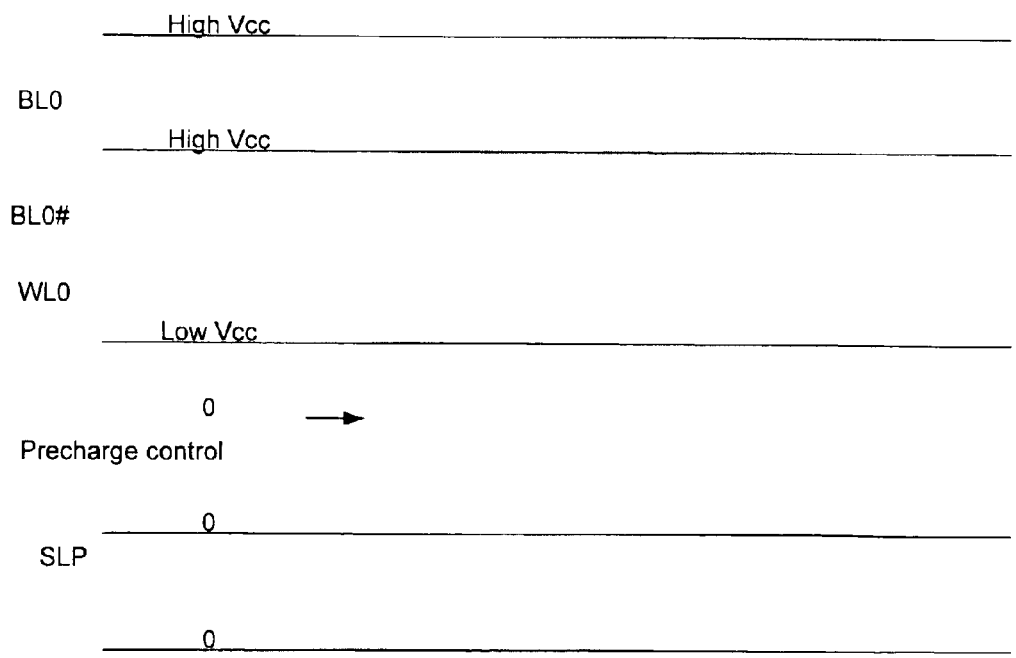
FIG. 7B illustrates a timing diagram for an SRAM block in a standby mode.

FIG. 7B illustrates a timing diagram for an SRAM block in a standby mode. In the standby mode, the precharge circuit 300 holds the bitlines BL0 and BL0# at a voltage of high Vcc volts. This is because the precharge control 325 is held at 0 volts causing transistors 310A–C to be turned on. Decoder circuit 230 disables the pass transistors 202A–B by asserting a Low Vcc volts on the gates of the pass transistors via wordline WL0. In the standby mode, the difference between the voltage asserted by the decoder circuit 230 and the voltage asserted by the precharge circuit 300, on the PMOS transistors 202A–B, is greater than 0 and less than the threshold voltage of the PMOS transistors 202A–B. The threshold voltage of a PMOS transistor may be defined as the minimum voltage between the source and the gate of the PMOS transistor required to turn the PMOS transistor is on. When the memory block is in the standby mode, the PMOS transistors 202A–B are in the sub-threshold region of the PMOS operational characteristic curve. Since the sub-threshold leakage current increases significantly with the increase of source to gate voltage of the PMOS transistors 202A–B, the PMOS transistors 202A–B have a larger leakage current in the standby mode. The larger leakage current of the PMOS transistors 202A–B enables the storage nodes 220 and 225 to maintain the binary bits stored thereon.

Figure 4:
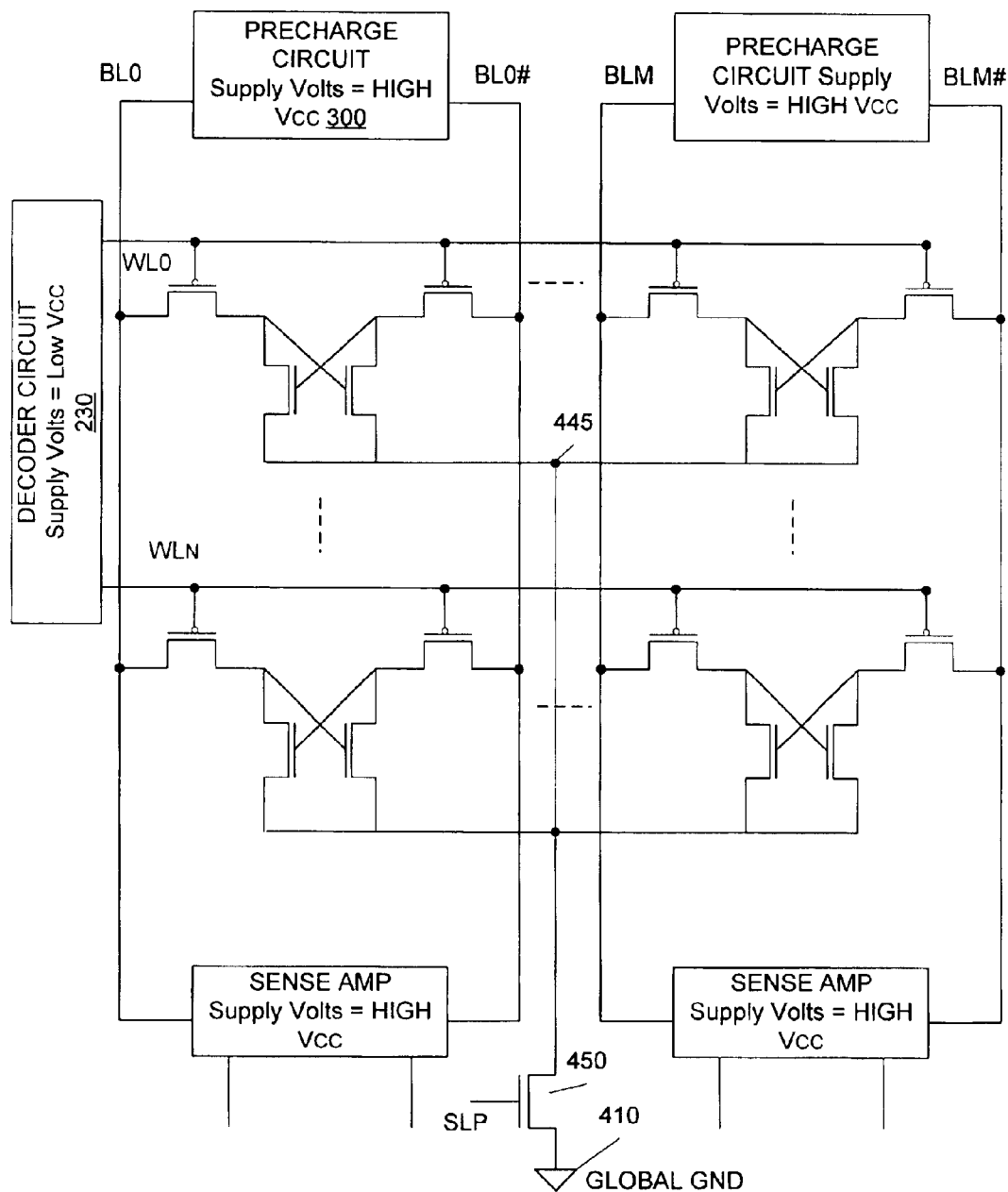
FIG. 4 illustrates an SRAM with a switched ground connection according to one embodiment of the invention.

FIG. 4 illustrates an SRAM with a switched ground connection according to one embodiment of the invention. FIG. 4 illustrates the SRAM of FIG. 2 with one of the terminals of each NMOS transistor 204A–B coupled to a global ground connection 410 via NMOS transistor switch 450. Although FIG. 4 illustrates an NMOS transistor switch, other embodiments of the invention may use any switch (e.g., a bipolar transistor switch, an op-amp switch, etc.) to switch the ground connection between global ground 410 and a virtual ground 445. The NMOS transistor switch 450 is controlled by a sleep signal (SLP) from, e.g., a memory controller (not shown) that turns the NMOS transistor switch 450 on when the memory block is in the active mode, and off when the memory block is in the standby mode. Thus, as illustrated in FIGS. 7A and 7B the NMOS transistor switch 450 is turned on by asserting a High Vcc volts on the gate of the NMOS transistor switch 450, and is turned off by asserting 0 volts on the gate of the NMOS transistor switch 450. In the embodiment of FIG. 4, when the SRAM block is in the active mode, a High Vcc volts is applied to the gate of the NMOS transistor switch 450 to minimize the voltage drop across the drain and source of the NMOS transistor switch. In particular, the High Vcc volts is applied to the gate of the NMOS transistor switch to ensure that when the NMOS transistor switch 450 is on, the voltage drop across the NMOS transistor switch 450 is substantially 0V, and the ground connection is substantially a global ground connection. Turning the NMOS transistor switch 450 off raises the ground connection of the SRAM block from global ground 410 to a virtual ground 445 reducing the leakage power consumed by the SRAM memory block in the standby mode, while maintaining the desirable large leakage currents of the PMOS transistors 202A–B. In the standby mode, the higher the virtual ground voltage the smaller is the leakage current. However, if the virtual ground voltage is raised too high, the data stored in the memory cell may become corrupt. Therefore, in one embodiment of the invention the voltage level of the virtual ground connection 445 is less than the threshold voltage of the NMOS pull-down transistors 204A–B. Having the voltage level of the virtual ground connection 445 less than the threshold voltage of the NMOS pull-down transistors 204A–B, maintains the integrity of the data stored on storage nodes 220 and 225. Adjustments to control the precise voltage level of the virtual ground 445 when the NMOS transistor switch 450 is off may be made by controlling the channel size of the NMOS transistor switch 450 during manufacture.

Figure 5:
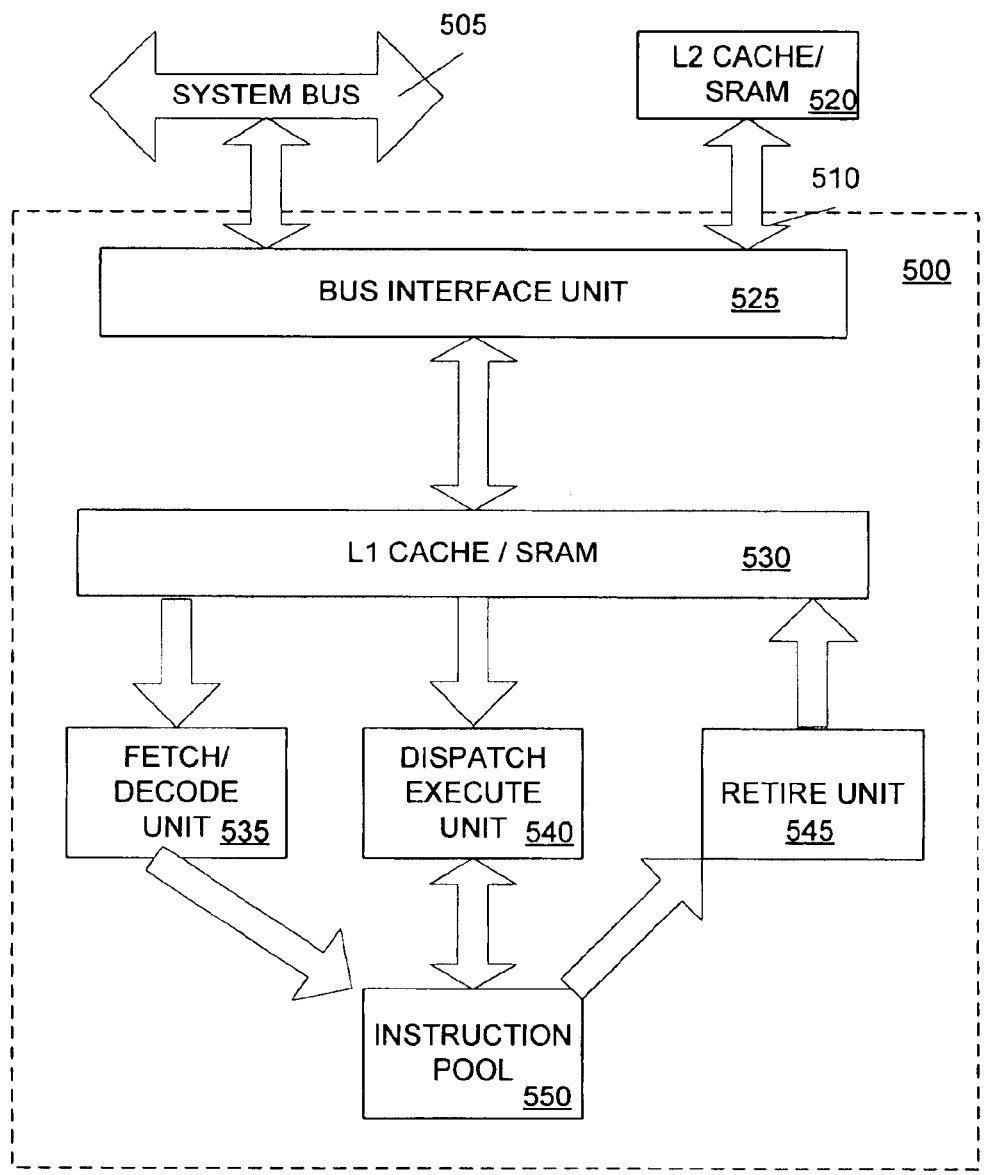
FIG. 5 illustrates a microprocessor using an SRAM according to one embodiment of the invention.

FIG. 5 illustrates a microprocessor using an SRAM according to one embodiment of the invention. As illustrated in FIG. 5 microprocessor 500 comprises an instruction pipeline subdivided into four processing units, i.e., the fetch/decode unit 535, the dispatch/execute unit 540, the retire unit 545, and the instruction pool 550. Instructions and data are supplied to the four processing units through the bus interface unit 525. The bus interface unit 525 obtains instructions and data from external memory (not shown) via system bus 505 or from L2 cache/SRAM 520 via bus 510, and stores the instructions and data in L1 cache/SRAM 530. In one embodiment of the invention, one or more of the L2 cache/SRAM 520 and/or the L1 cache/SRAM 530 comprises SRAM cells as described above with respect to FIGS. 2 and 4. The fetch/decode unit 535 reads a stream of instructions from L1 cache/SRAM 560 and decodes them into a series of "micro-ops" that is sent to the instruction pool 550. The instruction pool 550 is basically a buffer that stores the micro-ops for the dispatch execute unit 540. The dispatch/execute unit 540 is an out-of-order unit that schedules and executes the micro-ops stored in the instruction pool according to data dependencies and resource availability and temporarily stores the results of these speculative executions. The retire unit 545 commits the results of the speculatively executed micro-ops to permanent machine state and removes the micro-ops from the instruction pool. The retire unit 545 checks the status of micro-ops in the instruction pool looking for micro-ops that have been executed and no longer have any dependencies with other micro-ops in the instruction pool. It then retires completed micro-ops in their original program order, taking into account interrupts, exceptions, breakpoints, and branch mispredictions. Although the embodiment of FIG. 5 uses an out-of-order processor to process instructions, other embodiments of the invention may use a sequential processor or any other processor, such as a digital signal processor, so long as the SRAM used in the processor is as described with respect to FIGS. 2 and 4.

Figure 6:
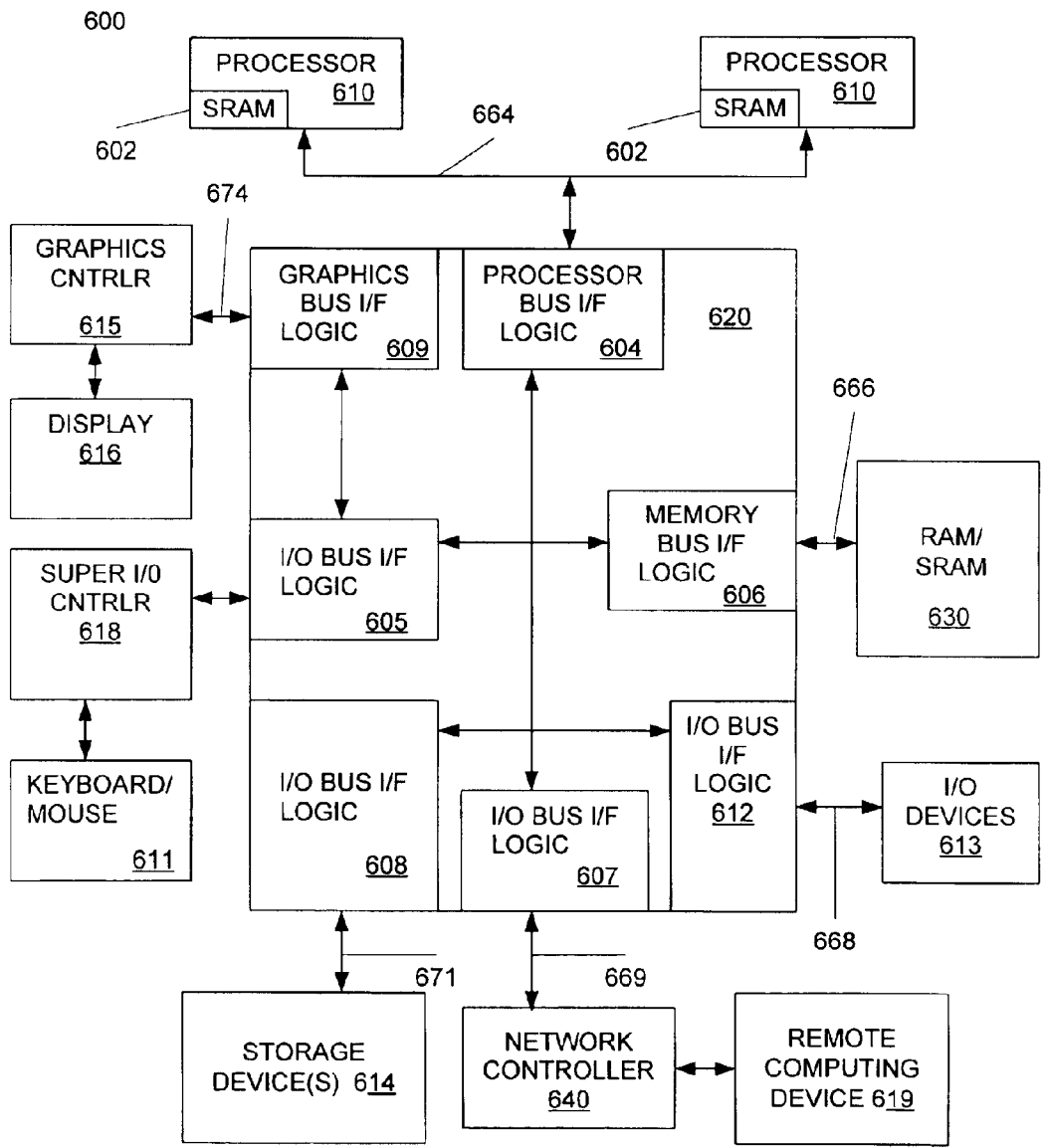
FIG. 6 illustrates a computer system using an SRAM according to one embodiment of the invention.

FIG. 6 illustrates a computer system using an SRAM according to one embodiment of the invention. As illustrated in FIG. 6, the computer system 600 may comprise one or more processors 610, and a chipset 620. Processors 610 may comprise SRAM 602 as illustrated with respect to FIGS. 2 and 4, and are coupled to chipset 620 via a processor bus 664. In one embodiment of the invention, the processor bus 664 is a front side bus (FSB) as used with Intel® corporation's Pentium 4 processor. Chipset 620 may comprise one or more integrated circuit packages or chips.

In one embodiment of the invention chipset 620 includes processor bus interface (I/F) logic 604 coupled between processor bus 664 and one or more interfaces within chipset 620. In one embodiment of the invention, chipset 620 includes memory bus interface logic 606 to couple the chipset 620 to a memory/SRAM 630 via a memory bus 666. Memory/SRAM 630 may include the SRAM as illustrated with respect to FIGS. 2 and 4. In one embodiment of the invention, chipset 620 includes Input/Output (I/O) bus interface logic 612 coupled to I/O devices 613 via, e.g., I/O bus 668. A second I/O bus interface logic 607 couples chipset 520 to a network controller 640 using, e.g., I/O bus 669.

In one embodiment of the invention, network controller 640 couples the computer system 600 to one or more remote computing devices 619. For example, network controller 640 may comprise an Ethernet controller, a cable modem, a digital subscriber line (DSL) modem, etc. that may be used to couple the computer system 600 to one or more remote computing devices 619.

A third I/O bus interface logic 608 couples chipset 620 to one or more storage devices 614 using, e.g., a I/O bus 671. The storage devices 614 may store program code and/or data permanently, e.g., on a hard disk, or a magnetic storage device. A graphics bus interface logic 609 couples chipset 620 to a graphics controller 615 via a graphics bus 674. I/O bus I/F logic 605 couples chipset 620 to super I/O controller 618 that is coupled to, e.g., a keyboard/mouse 611 etc.

Graphics controller 615 is coupled to display device 616. In one embodiment of the invention graphics controller 615 may include one or more digital to analog converters (DACs) (not shown) and SRAM (not shown) as illustrated with respect to FIGS. 2 and 4 above. The SRAM stores color palette entries that are needed to generate the analog signals to drive display device 616. A logical color number may be fed into the address inputs (wordlines) of the SRAM to select a color palette entry. This color palette entry may be composed of three separate values corresponding to the three components (red, green, and blue) of the desired physical color. Each component value may be fed to a separate DAC, and the analog output from each of the DACs may be coupled to the electron gun (or equivalent for devices not using an electron gun) of display device 616.

Thus a method and apparatus have been disclosed for a 4T SRAM. While there has been illustrated and described what are presently considered to be example embodiments of the present invention, it will be understood by those skilled in the art that various other modifications may be made, and equivalents may be substituted, without departing from the true scope of the invention. Additionally, many modifications may be made to adapt a particular situation to the teachings of the present invention without departing from the central inventive concept described herein. Therefore, it is intended that the present invention not be limited to the particular embodiments disclosed, but that the invention include all embodiments falling within the scope of the appended claims.

What is claimed is:

1. A memory cell comprising:
a pass transistor, a pull-down transistor, a first power supply, a second power supply, a precharge circuit, and a decoder circuit, each transistor having a threshold voltage, a gate and a channel, the channel having a first end and a second end, the second end of the channel of the pass transistor coupled to the first end of the channel of the pull-down transistor, and the second end of the channel of the pull-down transistor coupled to a ground connection, the first end of the channel of the pass transistor coupled to the first power supply via the precharge circuit and the gate of the pass transistor coupled to the second power supply via the decoder circuit, the first power supply and the second power supply each having a different power supply voltages, wherein the ground connection is coupled to a global ground connection when a memory block comprising the memory cell is in an active mode, and the ground connection is a virtual ground connection when the memory block is in a standby mode.

2. The memory cell of claim 1, wherein a difference in the power supply voltage between the first power supply and the second power supply is greater than 0 and less than the threshold voltage of the pass transistor.

3. The memory cell of claim 1, wherein the pass transistor is a p-channel metal oxide semiconductor field effect transistor, and the pull-down transistor is a n-channel metal oxide semiconductor field effect transistor.

4. The memory cell of claim 1, wherein the virtual ground connection is at a higher voltage than the global ground connection.

5. The memory cell of claim 1, further comprising a switch to couple the ground connection to the global ground connection.

6. The memory cell of claim 5, wherein the switch is responsive to a signal from a memory controller.

7. The memory cell of claim 1, further comprising a sense amplifier to couple the memory cell to a data output line.

8. The memory cell of claim 7, wherein the sense amplifier's power supply voltage is equal to the memory precharge circuit's power supply voltage.

9. A system comprising:
a first power supply and a second power supply each power supply having a different power supply voltage;
a processor; and
a cache memory coupled to the processor, the cache memory comprising
a plurality of pass transistors coupled to a corresponding plurality of pull-down transistors, the plurality of pull-down transistors coupled to a ground connection, each transistor in the plurality of pass transistors having a gate and a source, the source of each pass transistor is coupled to the first power supply via a precharge circuit and the gate of each pass transistor is coupled to the second power supply via a decoder circuit, wherein the around connection is coupled to a global ground connection when the cache memory is in an active mode, and the ground connection is a virtual around connection when the cache memory is in a standby mode.

10. The system of claim 9, wherein a difference in the power supply voltage between the first power supply and the second power supply is greater than 0 and less than the threshold voltage of the pass transistors.

11. The system of claim 9, wherein the plurality of pass transistors are a p-channel metal oxide semiconductor field effect transistors, and the plurality of pull-down transistors are a n-channel metal oxide semiconductor field effect transistors.

12. The system of claim 9, wherein the virtual ground connection is at a higher voltage than the global ground connection.

13. The system of claim 12, further comprising a switch to couple the ground connection to the global ground connection.

14. The system of claim 13, wherein the switch is responsive to a signal from a memory controller.

15. The system of claim 9, further comprising a sense amplifier coupled to the first power supply to couple the cache memory to a data output line.

16. The system of claim 9, wherein the cache memory is internally disposed in the processor.

17. A method comprising:
precharging at least one bitline coupled to a memory cell, the memory cell comprising at least one pass transistor, and at least one pull-down transistor, each transistor having a gate, a source, and a threshold voltage;
maintaining a value in the memory cell when the at least one pass transistor is in a standby mode by operating the at least one pass transistor in a sub-threshold region; and
switching a ground connection between a global ground and a virtual ground when a memory block comprising the memory cell switches from an active mode to a standby mode.

18. The method of claim 17, wherein operating the at least one pass transistor in a sub-threshold region comprises applying a voltage between the source and the gate of the at least one pass transistor, the voltage being greater than 0 and less than the threshold voltage of the at least one pass transistor.

19. The method of claim 17, wherein switching a ground connection between a global ground and a virtual ground comprises:
receiving a signal from a memory controller; and switching the ground connection of the memory cell from a global ground to a virtual ground responsive to the signal received.

20. A 4-transistor static random access memory (SRAM) cell comprising:
   a first and a second pass transistor;
   a first pull-down transistor coupled to the first and second pass transistor;
   a second pull-down transistor coupled to the first and second pass transistor;
   a first power supply, having a first supply voltage, coupled to the first and the second pass transistor via a pre charge circuit;
   a second power supply having a different supply voltage compared with the first supply voltage, coupled to a gate of the first and second pass transistors via a decoder circuit; and
   a switch coupled to the first and second pull-down transistors to change a around connection from a global around to a virtual around.

21. The 4-transistor SRAM of claim 20, wherein the switch responsive to a signal from a memory controller changes the ground connection from a virtual ground to a global ground and vice versa.

22. The 4-transistor SRAM of claim 20, wherein the difference in the supply voltage of the first transistor and the second transistor is less than a threshold voltage of the first and the second pass transistors.

23. An apparatus comprising:
   a bus interface unit;
   a core to process instructions; and
   a memory cell coupled to the bus interface unit and the core said memory cell comprising a pass transistor and a pull-down transistor, each transistor having a threshold voltage, a gate and a channel, the channel having a first end and a second end, the second end of the channel of the pass transistor coupled to the first end of the channel of the pull-down transistor, and the second end of the channel of the pull-down transistor coupled to a ground connection, the first end of the channel of the pass transistor coupled to a first power supply and the gate of the pass transistor coupled to a second power supply, the first power supply and the second power supply each having a different power supply voltage, wherein the around connection is coupled to a virtual ground connection when a memory block comprising the memory cell is in a standby mode, and the ground connection is a global ground connection when the memory block is in an active mode.

24. The apparatus of claim 23, wherein a difference in the power supply voltage between the first power supply and the second power supply is greater than 0 and less than the threshold voltage of the pass transistor.

25. An apparatus comprising:
   a bus interface unit;
   a core to process instructions; and
   a memory cell coupled to the bus interface unit and the core said memory cell comprising a pass transistor and a pull-down transistor, each transistor having a threshold voltage, a gate and a channel, the channel having a first end and a second end, the second end of the channel of the pass transistor coupled to the first end of the channel of the pull-down transistor, and the second end of the channel of the pull-down transistor coupled to a ground connection, the first end of the channel of the pass transistor coupled to a first power supply and the gate of the pass transistor coupled to a second power supply, the first power supply and the second power supply each having a different power supply voltage; and
   a switch to couple the ground connection between the global ground connection and the virtual ground connection.

26. The apparatus of claim 23, wherein the memory cell is disposed locally to the core.

27. The apparatus of claim 25, wherein a difference in the power supply voltage between the first power supply and the second power supply is greater than 0 and less than the threshold voltage of the pass transistor.

28. The apparatus of claim 25, wherein the memory cell is disposed locally to the core.

29. A system comprising:
   a first power supply to supply a first power supply voltage;
   a second power supply to supply a second power supply voltage, wherein the first power supply voltage is different from the second power supply voltage;
   a processor; and
   a Static Random Access Memory (SRAM) coupled to the processor, the SRAM comprising
      a plurality of pass transistors coupled to a corresponding plurality of pull-down transistors, the plurality of pull-down transistors coupled to a ground connection, each transistor in the plurality of pass transistors having a gate and a source, the source of each pass transistor is coupled to the first power supply via a precharge circuit and the gate of each pass transistor is coupled to the second power supply via a decoder circuit, wherein the ground connection is coupled to a global ground connection while the cache memory is in an active mode, and the ground connection is a virtual ground connection while the cache memory is in a standby mode.

30. The system of claim 29, wherein a difference between the first power supply voltage and the second power supply voltage is greater than zero and less than the threshold voltage of the pass transistors.

31. The system of claim 29, wherein the virtual ground connection is at a higher voltage than the global ground connection.

32. The system of claim 31, further comprising a switch to couple the ground connection to the global ground connection.

33. The system of claim 32, wherein the switch is responsive to a signal from a memory controller.

34. The system of claim 29, further comprising a sense amplifier coupled to the first power supply to couple the SRAM to a data output line.

* * * * *